United States Patent [19]

Rovnyak

[11] 4,197,521

[45] Apr. 8, 1980

[54] THICK FILM FUSING RESISTOR

[75] Inventor: Richard M. Rovnyak, Schaumburg, Ill.

[73] Assignee: GTE Automatic Electric Laboratories Incorporated, Northlake, Ill.

[21] Appl. No.: 951,705

[22] Filed: Oct. 16, 1978

[51] Int. Cl.² .............................................. H01C 10/00
[52] U.S. Cl. ................................... 338/195; 338/308; 338/314
[58] Field of Search ......................... 339/195, 306–309, 339/314; 29/620

[56] References Cited
U.S. PATENT DOCUMENTS 4,041,440  8/1977  Davis et al. ........................... 338/195

FOREIGN PATENT DOCUMENTS 1314388  4/1973  United Kingdom ..................... 338/195

OTHER PUBLICATIONS

Siemens AG, German Printed Application, 2611819.

Primary Examiner—C. L. Albritton
Attorney, Agent, or Firm—Robert J. Black; Gregory G. Hendricks

[57] ABSTRACT

A thick film resistor which fuses at low continuous current yet withstands high voltage pulses. The resistor design comprises a series of smaller thick film resistors disposed on a ceramic substrate, each having laser trimmed kerfs strategically located to control current flow and prevent voltage arcing across the kerfs.

10 Claims, 2 Drawing Figures

THICK FILM FUSING RESISTOR

BACKGROUND OF THE INVENTION

1. Field of the Invention

The present invention relates to battery feed and line feed resistors as used in telephone line circuits and more particularly to a thick film resistor capable of withstanding high voltage pulses yet capable of fusing at low continuous current.

2. Description of the Prior Art

Line feed and battery feed resistors are susceptible to lightening strikes and therefore must be capable of withstanding such high voltage pulses. However, in order to protect telephone central office circuits, the line feed and battery feed paths must be broken when continuous extraneous current at even low levels, is applied to these resistors. The conventional solution to this problem is to use a discrete resistor, capable of withstanding lightening surges, in series with a fuse. However, this solution is expensive in terms of both cost and space.

The present invention solves this problem by using a low cost thick film resistor in place of both a high voltage resistor and a fuse.

Accordingly it is the object of this invention to provide an economical solution to the problem of protecting telephone central office circuits with line feed and battery feed resistors that can both withstand high pulsed power, and fuse at low continuous power levels.

SUMMARY OF THE INVENTION

The present invention is a resistor for use as a line feed or battery feed resistor in the line circuits in telephone central offices. The resistor includes a non-conducting ceramic substrate on which is deposited a thick film of resistive material. The resistor is long relative to its width and is divided along its length into smaller resistors by a series of conductors crossing the width of the substrate. The resistive material is then cut by laser beam or abrasive jet to create a plurality of slits or channels referred to as kerfs, perpendicular to the direction of current flow across the resistive film. These kerfs restrict current flow to that area of the resistive film between the terminals and away from the kerfs. This restriction creates resistance and also causes a high current region to form where the current flows, which will heat up and fuse when continuous current is applied to the resistor in excess of the thermal threshold of the substrate. Also, since the substrate is heat sensitive, it will not fuse in response to high voltage pulses since the short duration of such voltages will not generate enough heat to crack the substrate.

DESCRIPTION OF THE PREFERRED EMBODIMENT

Figure 1:
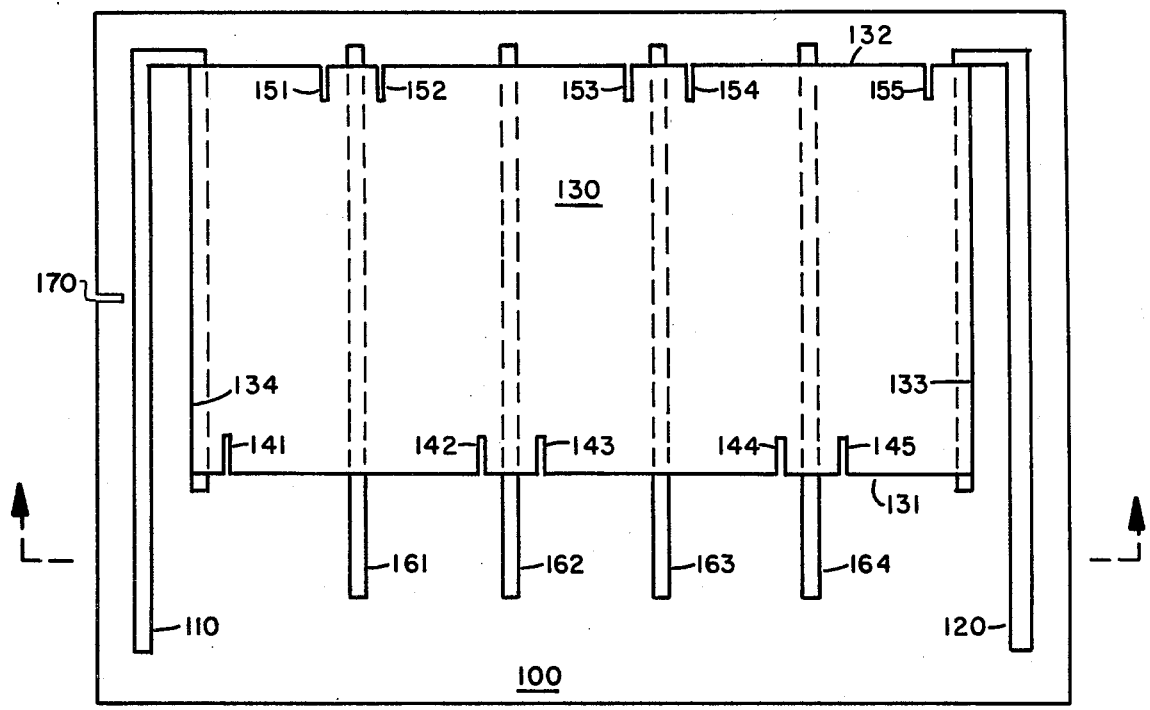
FIG. 1 is a diagram of the physical location of the conductors and the kerfs which are cut in the resistive film of a thick film resistor in accordance with the present invention.

Referring now to FIG. 1, the resistor 100 is shown connected between terminals 110 and 120. The resistor 100 includes a resistive film 130, deposited on a ceramic substrate 140, and connected to terminals 110 and 120. A series of conductors, 161-164, are then disposed across the width of the substrate to create a series of smaller resistors, 101, 102, 103, 104 and 105. A series of kerfs, 141-145 and 151-155 are cut into the resistive film parallel to these conductors. Each kerf extends from one edge, 131 or 132, into the center of the resistive material 130. Since the kerfs restrict current flow to the resistive film away from the kerfs they define a channel for current flow. The resultant channel will heat up in response to current flow and since the ceramic substrate is heat sensitive, it will crack in response to continuous current flowing through the channel. Since heat requires time to develop, the substrate will not crack in response to short duration high voltage pulses.

In the present embodiment five resistor sections are used, although four would be the minimum required to meet voltage gradient requirements, since arc over across kerfs occurs at 300 volts and this resistor is intended for 1000 volt applications. The distance between kerf ends, 141-145 and 151-155 is maximized by utilizing a plurality of small kerfs rather than 1 large kerf for the intended resistance. This provides a wider current channel for heat distribution which allows the resistor to be used in higher pulse current applications.

Kerfs are cut in each resistor section in a pattern to minimize distance of current flow which approaches a straight line. Since current is concentrated between kerfs, the pattern shown in FIG. 1 will tend to straighten out the current path, creating a more contiguous line of higher current density enabling the substrate to crack at lower continous current levels.

The resistor may be caused to crack the substrate at still lower inputs of continuous current by creating a high mechanical stress point 170 at a strategic point in the high heat area such as a laser scribe or other mechanically derived notch.

Figure 2:
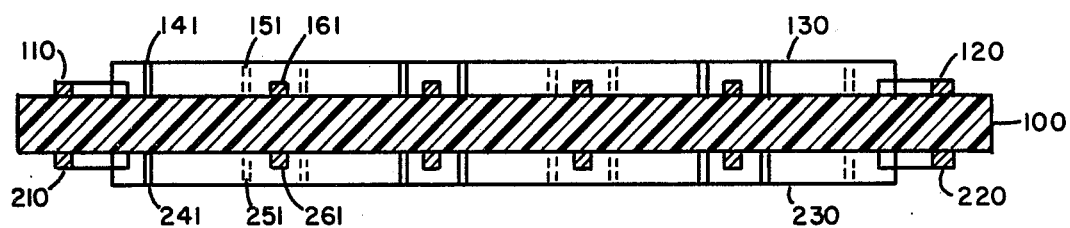
FIG. 2 is an edge view of two resistors on one substrate.

A double sided resistor can be used with a single substrate to cause fracturing of the substrate at still lower current levels, since the heat from two resistors would then be applied to one substrate. This configuration is shown in FIG. 2.

The terminal paths 110, 120, and 210, and 220 are located such that they will be cut when the substrate fractures since fractures usually occur on a line between the two series of kerfs.

An advantage in using two resistors of like design on one substrate is realized when a power cross failure occurs. Since the power may be imposed on both tip and ring leads, the resistors will heat up together and cooperate in causing substrate fracturing and circuit interruption at power levels far below that of individual resistors. In the event only one lead becomes exposed, to continuous current, the resistor included in that lead will heat up and crack the substrate to interrupt both tip and ring, removing the threat completely from the line circuit.

What is claimed is:

1. A resistor for use in telephone line circuits, comprising a film of resistive material, disposed on a ceramic substrate, connected between at least first and second conductive terminal means;

said resistive material separated into smaller sections of resistive material by conductors disposed on said resistive material;

said resistive material including at least one kerf in each resistor section, one end of each kerf terminating at an edge of said resistive material, and the other end of each kerf terminating away from the edge of said resistive material and extending into the region of current flow;

said resistor is long relative to its width creating a region of high current density across the substrate length;

at least one additional kerf or stress point is made in the high current density region facilitating substrate fracturing at low continuous current levels.

2. A resistor as claimed in claim 1, wherein: there is included first and second pluralities of kerfs; one end of said first plurality of kerfs terminate at one edge of said resistive material and one end of said second plurality of kerfs terminate at an opposite edge of said resistive material resulting in an electrical current path between said first and said second plurality of kerfs.

3. A resistor for use in telephone line circuits, comprising a film of resistive material, disposed on a ceramic substrate, connected between at least first and second conductive terminal means;

said resistive material separated into smaller sections of resistive material by conductors disposed on said resistive material;

said resistive material including at least one kerf in each resistor section, one end of each kerf terminating at an edge of said resistive material, and the other edge of each kerf terminating away from the edge of said resistive material and extending into the region of current flow;

said resistive material is disposed on both sides of said ceramic substrate, facilitiating substrate fracturing at low continuous current levels.

4. A resistor as claimed in claim 1 or claim 3, wherein: each of said kerfs are parallel to each other.

5. A resistor as claimed in claim 1 or claim 3, wherein: each of said kerfs are of equal length.

6. A resistor as claimed in claim 1 or claim 3, wherein: each of said kerfs are perpendicular to the current channel between said conductive means.

7. A resistor as claimed in claim 1 or claim 3, wherein: said kerfs are trimmed to desired size by laser means.

8. A resistor as claimed in claim 2, wherein: at least two kerfs are cut in each resistor section, each kerf on opposite edges.

9. A resistor as claimed in claim 8, wherein: each of said kerfs are positioned in each resistor section to minimize the distance of current flow across said resistor.

10. A resistor as claimed in claim 1 or claim 3, wherein: at least one conductive terminal means is disposed on said substrate in such a position that it will become non-conductive when said substrate fractures.

* * * * *